(12) United States Patent
Laird et al.

(10) Patent No.: US 8,987,035 B2
(45) Date of Patent: Mar. 24, 2015

(54) METHOD FOR PRODUCING AN INFRARED LIGHT DETECTOR

(75) Inventors: Ron Laird, North Lanarkshire (GB); Scott Freeborn, Edinburgh (GB); Archie Shaw Stewart, Doune (GB)

(73) Assignee: Pyreos, Ltd., Edinburgh (GB)

( * ) Notice: Subject to any disclaimer, the term of this patent is extended or adjusted under 35 U.S.C. 154(b) by 98 days.

(21) Appl. No.: 13/518,667

(22) PCT Filed: Dec. 21, 2010

(86) PCT No.: PCT/EP2010/070372
§ 371 (c)(1),
(2), (4) Date: Sep. 12, 2012

(87) PCT Pub. No.: WO2011/076788
PCT Pub. Date: Jun. 30, 2011

(65) Prior Publication Data
US 2012/0329198 A1    Dec. 27, 2012

(30) Foreign Application Priority Data

Dec. 23, 2009   (DE) .................. 10 2009 060 217

(51) Int. Cl.
*H01L 31/18*    (2006.01)
*H01L 27/146*   (2006.01)
(Continued)

(52) U.S. Cl.
CPC ........ *H01L 27/1465* (2013.01); *H01L 27/1469* (2013.01); *H05K 3/34* (2013.01);
(Continued)

(58) Field of Classification Search
None
See application file for complete search history.

(56) References Cited

U.S. PATENT DOCUMENTS

| 5,024,372 A | 6/1991 | Altman et al. |
| 5,406,701 A | 4/1995 | Pepe et al. |

(Continued)

FOREIGN PATENT DOCUMENTS

| DE | 694 17 351 T2 | 10/1999 |
| DE | 10 2007 024 902 A1 | 12/2008 |
| DE | 10 2008 053 083 A1 | 7/2010 |
| JP | 8-204166 A | 8/1996 |

*Primary Examiner* — Charles Garber
*Assistant Examiner* — Stanetta Isaac
(74) *Attorney, Agent, or Firm* — Edell, Shapiro & Finnan, LLC

(57) ABSTRACT

A method for producing an infrared light detector (1) has the steps of: providing a plurality of connection pins (11, 12), which are kept parallel to one another and arranged with one of the longitudinal ends (17, 18) thereof in a horizontal plane, and a printed circuit board (6) with a planar underside (8), in which a recess (15, 16) of the same form in each case is provided for each of the connection pins (11, 12); filling the recesses (15, 16) with a solder paste, so that in each of the recesses (15, 16) there is a solder paste body (21) with the same amount of solder paste; positioning the printed circuit board (6) over the connection pins (11, 12), so that each of the connection pins (11, 12) extends with its longitudinal end (17, 18) in the recess (15, 16) assigned to it and dips in the solder paste body (21) located in the respective recess (15, 16); liquefying the solder paste bodies (21), so that electrically conducting connections are formed between the connection pins (11, 12) and the solder paste bodies (21) and, on account of the surface tension in the solder paste bodies (21) and the dead weight of the printed circuit board (6), the underside (8) of the printed circuit board (6) is aligned parallel to the horizontal plane; solidifying the solder paste bodies (21), so that mechanically secure connections are formed by the solder paste bodies (21) between the printed circuit board (6) and the connection pins (11, 12) and the alignment of the underside (8) of the printed circuit board (6) parallel to the horizontal plane is fixed.

6 Claims, 2 Drawing Sheets

(51) Int. Cl.
*H05K 3/34* (2006.01)
*H01L 23/00* (2006.01)
*H01L 31/0203* (2014.01)
*H01L 31/101* (2006.01)

(52) U.S. Cl.
CPC .......... *H01L 24/48* (2013.01); *H01L 27/14618* (2013.01); *H01L 27/14636* (2013.01); *H01L 27/14649* (2013.01); *H01L 31/0203* (2013.01); *H01L 31/101* (2013.01); *H01L 31/18* (2013.01); *H01L 2924/15312* (2013.01); *H05K 3/341* (2013.01); *H05K 2201/09036* (2013.01); *H05K 2201/10318* (2013.01); *H01L 2224/48* (2013.01)

USPC .................................. 438/65; 257/E31.124

(56) References Cited

U.S. PATENT DOCUMENTS

| | | | |
|---|---|---|---|
| 5,591,959 | A | 1/1997 | Cigna et al. |
| 6,225,573 | B1 * | 5/2001 | Nakamura .................... 174/267 |
| 2003/0057426 | A1 * | 3/2003 | Miyazaki et al. ............... 257/88 |
| 2006/0079009 | A1 * | 4/2006 | Salmon et al. ................. 438/14 |
| 2007/0164082 | A1 * | 7/2007 | Suehiro ......................... 228/101 |
| 2008/0251872 | A1 * | 10/2008 | Kwon et al. ................... 257/432 |
| 2009/0284940 | A1 * | 11/2009 | Suehiro ......................... 361/760 |
| 2011/0006211 | A1 | 1/2011 | Giebeler et al. |
| 2011/0272582 | A1 * | 11/2011 | Giebeler .................. 250/339.01 |

* cited by examiner

METHOD FOR PRODUCING AN INFRARED LIGHT DETECTOR

FIELD AND BACKGROUND OF THE INVENTION

The invention relates to a method for producing an infrared light detector.

A conventional infrared light detector has a circuit board and a plurality of sensor chips on the top side of said circuit board, wherein the sensor chips are constructed to detect infrared light. In order that the sensor chips can be irradiated with infrared light having different wavelength bands, infrared light filters having a corresponding design are positioned in front of the sensor chips, and are integrated into a housing of the infrared light detector, for example. The housing is formed by a cup-shaped housing cap and a housing floor which closes off the former, and the circuit board and the sensor chips thereof are arranged in the interior of the housing. The sensor chips are positioned facing their associated infrared light filter, and are operated by an electronic circuit which is attached to the circuit board. The electrical signals generated in the sensor chips can be tapped by connection pins which are connected to the circuit board, wherein the connection pins are routed from the circuit board through the housing floor to the exterior of the housing. The connection pins are routed through holes in the circuit board for the purpose of creating an electrical connection between the connection pins and the electric circuit located on the circuit board. However, because of the presence of these holes in the circuit board, the space available for the arrangement of the sensor chips and of the circuit is limited, and as a result the component density of the infrared light detector is low.

In order for the sensor chips to have high measurement precision, it is especially necessary for the infrared light filters to have a high degree of parallelism with their sensor chips. Because the sensor chips are arranged on the circuit board as integrated components, and the infrared light filters are arranged in the housing cap as integrated components, the result is sufficient parallelism between the circuit board and the housing cap. Complex measures are required during the manufacture of the infrared light detector to achieve this.

SUMMARY OF THE INVENTION

The problem addressed by the invention is that of creating a method for producing an infrared light detector, wherein the infrared light detector has a high component density and high precision.

The method according to the invention for producing an infrared light detector has the following steps: provision of a plurality of connection pins which are held parallel to each other and which are arranged with all of their one longitudinal ends in a horizontal plane, wherein the connection pins extend downward from the horizontal plane, and [provision] of a circuit board having a flat bottom side, wherein a recess is provided in said bottom side for each of the connection pins, and each recess is arranged in the region of the circuit board where the connection pin associated with the respective recess will be connected, wherein the recesses each have the same shape; filling of the recesses with a solder paste, such that a solder paste body with the same amount of solder paste is found in each of the recesses; positioning of the circuit board above the connection pins, such that the longitudinal end of each of the connection pins extends inside the recess associated with the connection pin and dips into the solder paste body situated in the respective recess; liquification of the solder paste bodies, such that electrically conductive connections are formed between the connection pins and the solder paste bodies, and such that the bottom side of the circuit board is oriented parallel to the horizontal plane as a result of the surface tension in the solder paste bodies and the dead weight of the circuit board; solidification of the solder paste bodies, such that mechanically rigid connections are formed with the solder paste bodies between the circuit boards and the connection pins, and such that the orientation of the bottom side of the circuit boards is fixed parallel to the horizontal plane.

The infrared light detector produced with the method according to the invention comprises the circuit board, wherein the top side thereof is free of recesses, such that the entire top side of the circuit board is available for accommodating the sensor chips and electronic circuits. Compared to a circuit board of an infrared light detector produced with a conventional method, wherein the circuit board has holes for connection pins, the space provided by the surface for the sensor chips and the electronic circuits is large. As a result, it is possible to achieve a high component density with the infrared light detector produced according to the invention, whereby the geometric dimensions of the infrared light detector produced according to the invention are smaller than the geometric dimensions of the infrared light detector produced in the conventional manner. In addition, the method according to the invention achieves a high degree of precision in the positioning of the connection pins with respect to the circuit board.

The circuit board is preferably positioned in such a manner that the longitudinal end of at least one of the connection pins is in contact with the base of the recess assigned to the connection pin. The liquification of the solder paste body is preferably achieved by heating the solder paste body, and the solidification of the solder paste body by cooling the solder paste body. In addition, it is preferred that a housing floor is provided as part of the method for producing the infrared light detector, and said housing floor is arranged parallel to the horizontal plane, wherein a passage is included in the housing floor for each of the connection pins, wherein the connection pin assigned to each respective passage extends through the same such that the connection pins are held in position in the passages by the housing floor. A high degree of parallelism is achieved in this way between the housing floor and the circuit board.

Additional preferred steps of the method for producing the infrared light detector are: provision of a cup-shaped housing cap; attachment of the housing cap to the housing floor such that a housing is formed by the housing floor and the housing cap, and the circuit board is accommodated in the housing. Because parallelism is achieved between the housing floor and the circuit board, a high degree of parallelism is likewise achieved between the circuit board and the housing cap.

Additional preferred steps are: attachment of at least one sensor chip on a top side of the circuit board which faces away from the bottom side; provision of an infrared filter in the housing cap, wherein said infrared filter is assigned to the sensor chip for the irradiation of the same with infrared light from outside the infrared light detector. As such, a high degree of parallelism between the sensors and their assigned infrared light filters is achieved with the production method according to the invention, because an exact positioning of the circuit board with the sensor chips via the connection pins, the housing floor, and the housing cap with respect to the infrared light filters is achieved.

As a result, the infrared light detector produced by means of the method according to the invention has a high degree of measurement precision.

BRIEF DESCRIPTION OF THE DRAWINGS

One preferred embodiment of an infrared light detector produced by means of the method according to the invention is explained below with reference to the attached schematic illustrations, wherein.

DETAILED DESCRIPTION OF A PREFERRED EMBODIMENT

Figure 1:
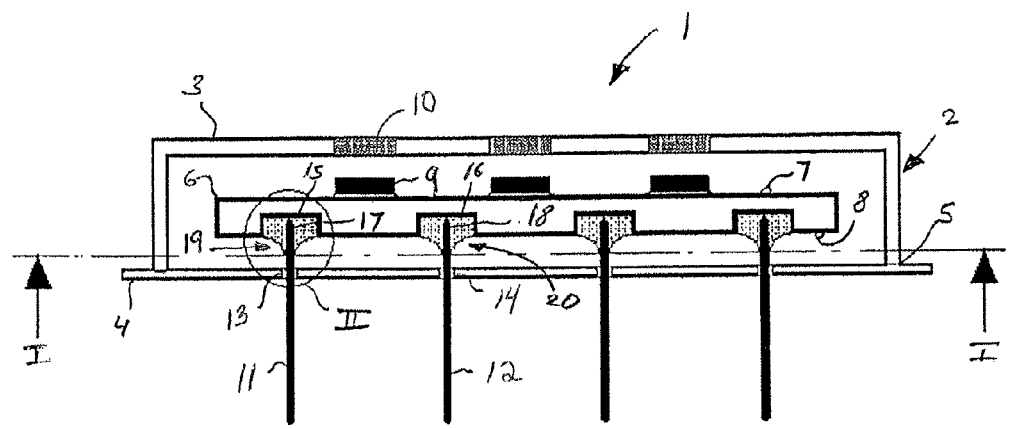
FIG. 1 shows a cross-section of the embodiment of the infrared light detector.
Figure 2:
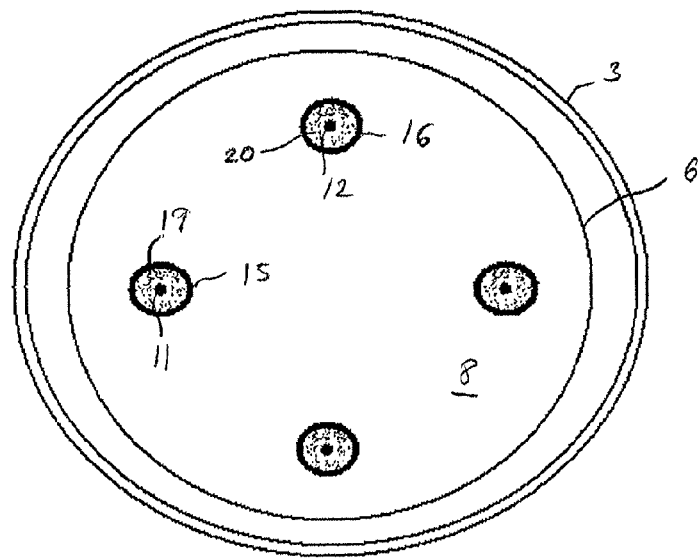
FIG. 2 shows cut plane I in FIG. 1.
Figure 3:
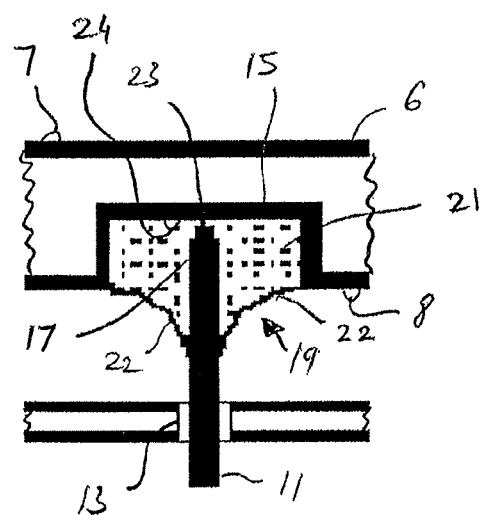
FIG. 3 shows detail II in FIG. 1.

As can be seen in FIGS. 1 to 3, an infrared light detector 1 produced according to the invention has a housing 2 which is formed by a housing cap 3 and a housing floor 4. The housing cap 3 is designed with a cup shape and is attached with its outer edge on the housing floor 4 by means of a bonded attachment 5. An interior space of the housing 2 is defined by the housing cap 3 and the housing floor 4, and a circuit board 6 is arranged inside this interior space. The circuit board 6 has a circuit board top side 7 and a circuit board bottom side 8, wherein the circuit board top side 7 is arranged at the top in FIG. 1, and the circuit board bottom side 8 is arranged at the bottom in FIG. 1. A plurality of sensor chips 9 four according to FIG. 2 is attached on the circuit board top side 7. One infrared light filter 10 is provided above each of the sensor chips 9, and each of the infrared light filters 10 is integrated in the housing cap 3. A plurality of connection pins 11, 12 is provided on the circuit board bottom side 8, and these are electrically connected to an electronic circuit (not shown) in the circuit board 6. The connector pins 11, 12 extend through the housing floor 4 perpendicularly. A passage 13, 14 is provided in the housing floor 4 for each of the connection pins 11, 12.

On the circuit board bottom side 8 there is a recess 15, 16 for each connection pin 11, 12, into which extends the longitudinal end 17, 18 of each connection pin 11, 12. The connection pins 11, 12 are attached in the recesses 15, 16 with solder attachments 19, 20, and are connected to the electronic circuit in an electrically conducting manner. The solder attachments 19, 20 are each formed by a solder body 21 which is produced in the recesses 15, 16 from solder paste. During the production of the solder attachments 19, 20, the solder bodies 21 were liquefied, wherein a solder body surface 22 like the surface of a cone was formed around each of the connection pins 11, 12. The longitudinal ends 17, 18 of the connection pins 11, 12 each have a tip 23 which abuts a recess base 24.

The following steps must be carried out during the production of the infrared light detector 1: the circuit board 6, in which the recesses 15, 16 must be produced, for example by means of etching, must be provided. The sensor chips 9 and the electronic circuit must be attached to the circuit board top side 7. In addition, the connection pins 11, 12 must be arranged parallel to each other and held in place, wherein the longitudinal ends 17, 18 of the connection pins 11, 12 are arranged in a horizontal plane and the connection pins 11, 12 extend perpendicular to the horizontal plane. In addition, the housing floor 4 with its passages 13, 14 is provided, wherein one of the connection pins 11, 12 is inserted into each of the passages 13, 14 and thereby is held in position at that location.

In this way, the connection pins 11, 12 are held parallel to each other and perpendicular to the housing floor 4 in a stable manner.

The locations of the connection pins 11, 12 and the recesses 15, 16 match each other in such a manner that one of the recesses 15, 16 is assigned to each of the connection pins 11, 12. The recesses 15, 16 must be designed with the same shape, for example by means of etching. In addition, the recesses must be filled with a solder paste, wherein the same amount of solder paste must be put in each of the recesses 15, 16. Next, the circuit board 6 is positioned above the connection pins 11, 12 such that the longitudinal end 17, 18 of each of the connection pins 11, 12 dips into the corresponding solder paste body 21. Next, the solder paste bodies 21 are, for example, heated in an oven to 300° C., such that the solder paste bodies liquefy. Due to the surface tension of the liquefied solder paste and the dead weight of the circuit board 6, the same is oriented in a manner centered with respect to the connection pins 11, 12. In this way, the circuit board 6 is brought into a perpendicular orientation in which the connection pins 11, 12 extend perpendicular to the circuit board 6.

Subsequently, the solder paste bodies 21 are cooled back down, whereby the solder paste bodies 21 solidify and a mechanically rigid connection is formed between the circuit board 6 and the connection pins 11, 12 in the recesses 15, 16, and an electrically conductive connections [sic] is formed between the connection pins 11, 12 and the electronic circuit via the solder paste bodies 21. The housing cap 3 is placed on the housing floor 4 over the circuit board 6, and the bonded attachment 5 is constructed.

The connection pins 11, 12 are held in a stable and precise manner in the housing floor 4 in their passages 13, 14. The circuit board 6 is, with the solder attachments 19, 20 in the recesses 15, 16, itself arranged precisely centered with respect to the connection pins 11, 12, and therefore with respect to the housing floor 4, due to the surface tension in the solder paste bodies 21 and to the dead weight of the circuit board 6. The housing cap 3 is placed on the housing floor 4 such that the infrared light filters 10 integrated into the housing cap 3 are arranged precisely with respect to the sensor chips 9. In this way, a high degree of parallelism is achieved between the sensor chips 9 and their functionally assigned infrared light filters 10, and the measurement precision of the infrared light detector 1 is thereby high. In addition, the entire circuit board surface 7 [sic] of the circuit board 6 is provided for the construction of the sensor chips 9 and the electronic circuit, and the infrared light detector 1 therefore has a high component density.

LIST OF REFERENCE NUMBERS 1 infrared light detector
2 housing
3 housing cap
4 housing floor
5 bonded attachment
6 circuit board
7 circuit board top side
8 circuit board bottom side
9 sensor chip
10 infrared light window
11 first connection pin
12 second connection pin
13 first passage
14 second passage
15 first recess
16 second recess 17 longitudinal end of the first pins
18 longitudinal end of the second pins
19 first solder attachment
20 second solder attachment
21 solder paste body
22 solder paste body surface
23 connection pin tip
24 recess base

The invention claimed is:

1. A method for producing an infrared light detector comprising:
    preparing a plurality of connection pins, which are arranged with longitudinal ends of the connection pins arranged in a horizontal plane, wherein the connection pins extend downward from the horizontal plane,
    providing a circuit board having a top side provided with a continuous surface and a flat bottom side provided with respective recesses for each of the longitudinal ends of the connection pins, wherein the recesses are arranged at locations on the bottom side of the circuit board corresponding to connection locations for the connection pins associated with the respective recesses, wherein the recesses each extend from the bottom side toward the top side, wherein the recesses each terminate at a respective base beneath the top side, and wherein the recesses each have a mutually uniform shape;
    filling the recesses with a solder paste such that solder paste bodies with mutually same solder paste amounts are found in each of the recesses;
    positioning the circuit board above the connection pins, such that the longitudinal end of each of the connection pins extends inside a respective recess, and dips into a respective solder paste body situated in the respective recess;
    liquifying the solder paste bodies, such that electrically conductive connections are formed between the longitudinal ends of the connection pins and the solder paste bodies, and as a result of surface tension in the solder paste bodies and the dead weight of the circuit board, the bottom side of the circuit board is oriented parallel to the horizontal plane;
    solidifying the solder paste bodies, such that mechanically rigid connections between the circuit board and the longitudinal ends of the connection pins are formed with the solder paste bodies, and such that the orientation of the bottom side of the circuit boards is fixed parallel to the horizontal plane; and
    attaching a plurality of sensor chips to the top side of the circuit board.

2. The method according to claim 1, wherein the circuit board is positioned such that the longitudinal end of at least one of the connection pins contacts the respective base of the recess associated with the at least one connection pin.

3. The method according to claim 1, wherein liquifying the solder paste bodies comprises heating the solder paste bodies and solidifying the solder paste bodies comprises cooling the solder paste bodies.

4. The method according to claim 1, further comprising providing a housing floor arranged parallel to the horizontal plane, in which a respective passage is provided for each of the connection pins, wherein through each of the passages extends the connection pin assigned thereto, such that the connection pins are held in position in the passages by the housing floor.

5. The method according to claim 4, further comprising:
    providing a cup-shaped housing cap;
    attaching the housing cap to the housing floor, such that a housing is formed by the housing floor and the housing cap, in which the circuit board is accommodated.

6. The method according to claim 5, further comprising:
    attaching at least one sensor chip on a top side of the circuit board which faces away from the bottom side;
    providing an infrared light filter in the housing cap which is functionally assigned to the sensor chip for irradiation thereof with infrared light from outside the infrared light detector.

* * * * *